(12) United States Patent
Levin et al.

(10) Patent No.: US 9,837,411 B2
(45) Date of Patent: Dec. 5, 2017

(54) SEMICONDUCTOR DIE WITH A METAL VIA

(71) Applicant: Tower Semiconductor Ltd., Migdal Haemek (IL)

(72) Inventors: Sharon Levin, Haifa (IL); Alexey Heiman, Ramat Ishay (IL); Sagy Levy, Zichron-Yaakov (IL)

(73) Assignee: TOWER SEMICONDUCTORS LTD., Migdal Haemeq (IL)

( * ) Notice: Subject to any disclaimer, the term of this patent is extended or adjusted under 35 U.S.C. 154(b) by 0 days.

(21) Appl. No.: 14/798,535

(22) Filed: Jul. 14, 2015

(65) Prior Publication Data

US 2017/0018503 A1      Jan. 19, 2017

(51) Int. Cl.
| H01L 21/70 | (2006.01) |
| H01L 27/092 | (2006.01) |
| H01L 21/74 | (2006.01) |
| H01L 29/78 | (2006.01) |
| H01L 29/10 | (2006.01) |

(52) U.S. Cl.
CPC .......... H01L 27/092 (2013.01); H01L 21/743 (2013.01); H01L 29/1087 (2013.01); H01L 29/1083 (2013.01); H01L 29/7816 (2013.01)

(58) Field of Classification Search
CPC .................... H01L 21/76898; H01L 21/02057

USPC .................................................. 257/338, 774
See application file for complete search history.

(56) References Cited

U.S. PATENT DOCUMENTS

| 7,705,440 B2 * | 4/2010 | Wang ................ H01L 21/76898 257/678 |
| 8,242,605 B2 * | 8/2012 | Arie .................. H01L 21/02057 257/340 |
| 9,190,408 B2 * | 11/2015 | Mallikarjunaswamy .................. H01L 21/82380 |
| 9,209,336 B2 * | 12/2015 | Sanfilippo ......... H01L 27/14643 |
| 9,224,596 B2 * | 12/2015 | Saxler ................. H01L 21/0237 |
| 2006/0223199 A1 * | 10/2006 | Ando ................ H01L 21/76898 438/3 |
| 2010/0181639 A1 * | 7/2010 | Huang .................. H01L 21/763 257/506 |
| 2013/0020719 A1 * | 1/2013 | Jung ................ H01L 21/76898 257/774 |
| 2014/0235052 A1 * | 8/2014 | Park .................. H01L 21/76898 438/653 |

* cited by examiner

*Primary Examiner* — Tan N Tran
(74) *Attorney, Agent, or Firm* — Reches Patents

(57) ABSTRACT

A semiconductor die that may include a substrate; an epitaxial layer; a metal layer; a first transistor; and a metal via that surrounds the first transistor, extends between the metal layer and the substrate, and penetrates the substrate.

19 Claims, 9 Drawing Sheets

SEMICONDUCTOR DIE WITH A METAL VIA

BACKGROUND OF THE INVENTION

As demands for higher currents & higher voltages keep increasing, the Electrical and Thermal isolation between Power components and the rest of the circuitry pose a great challenge in modern PMIC designs.

Conventional bipolar-double diffused metal oxide—complementary metal oxide (BCD) manufacturing processes use heavily doped buried regions, subsequent silicon epitaxial growth and heavily doped sinker implants & diffusions for contacting the buried regions from the top. Other processes are using silicon on insulator (SOI) wafers to get the required isolation, however both options are quite expensive and increase the process complexity.

SUMMARY

According to an embodiment of the invention there may be provided a semiconductor die that may include a substrate, an epitaxial layer, a metal layer, a first transistor; and a metal via that surrounds the first transistor, extends between the metal layer and the substrate, and penetrates the substrate.

The metal via may directly contact (without isolation) the epitaxial layer.

The metal via may be coated by an isolating material.

The substrate and the epitaxial layer may be n-type semiconductors.

The metal via may be prevented from contacting any p-type semiconductor region of the semiconductor die.

The metal via may be spaced apart (for example 7 microns apart for 60 volte semiconductor dies) from any p-type semiconductor region of the semiconductor die thereby preventing a formation of a depletion layer between the metal layer and any p-type semiconductor region of the semiconductor die.

The substrate and the epitaxial layer may be p-type semiconductors.

The metal via may be prevented from contacting any n-type semiconductor region of the semiconductor die.

The metal via may be spaced apart from any n-type semiconductor region of the semiconductor die thereby preventing a formation of a depletion layer between the metal layer and any n-type semiconductor region of the semiconductor die.

The substrate may not include a buried region.

The substrate may include a buried region.

The metal via may contacts buried region that may be formed within the substrate. The buried region has a higher doping concentration than the substrate.

The metal via may contact the buried region to form a Ohamic contact.

The depth of the metal via may range between 5 and 50 micron.

A width of a cross section of the metal via may range between 1 and 3 microns.

The semiconductor die may include a second transistor that may be positioned outside an area surrounded by the metal via. The metal via may be configured to isolate the first transistor from the second transistor.

The first transistor may be a double diffused metal oxide transistor and the second transistor may be a complementary metal oxide transistor.

The first transistor may belong to a high power circuit. The second transistor may belong to a low power circuit.

The power dissipated by the high power circuit exceeds a power dissipated by the low power circuit.

The first transistor and the second transistor may be of a same type of transistors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
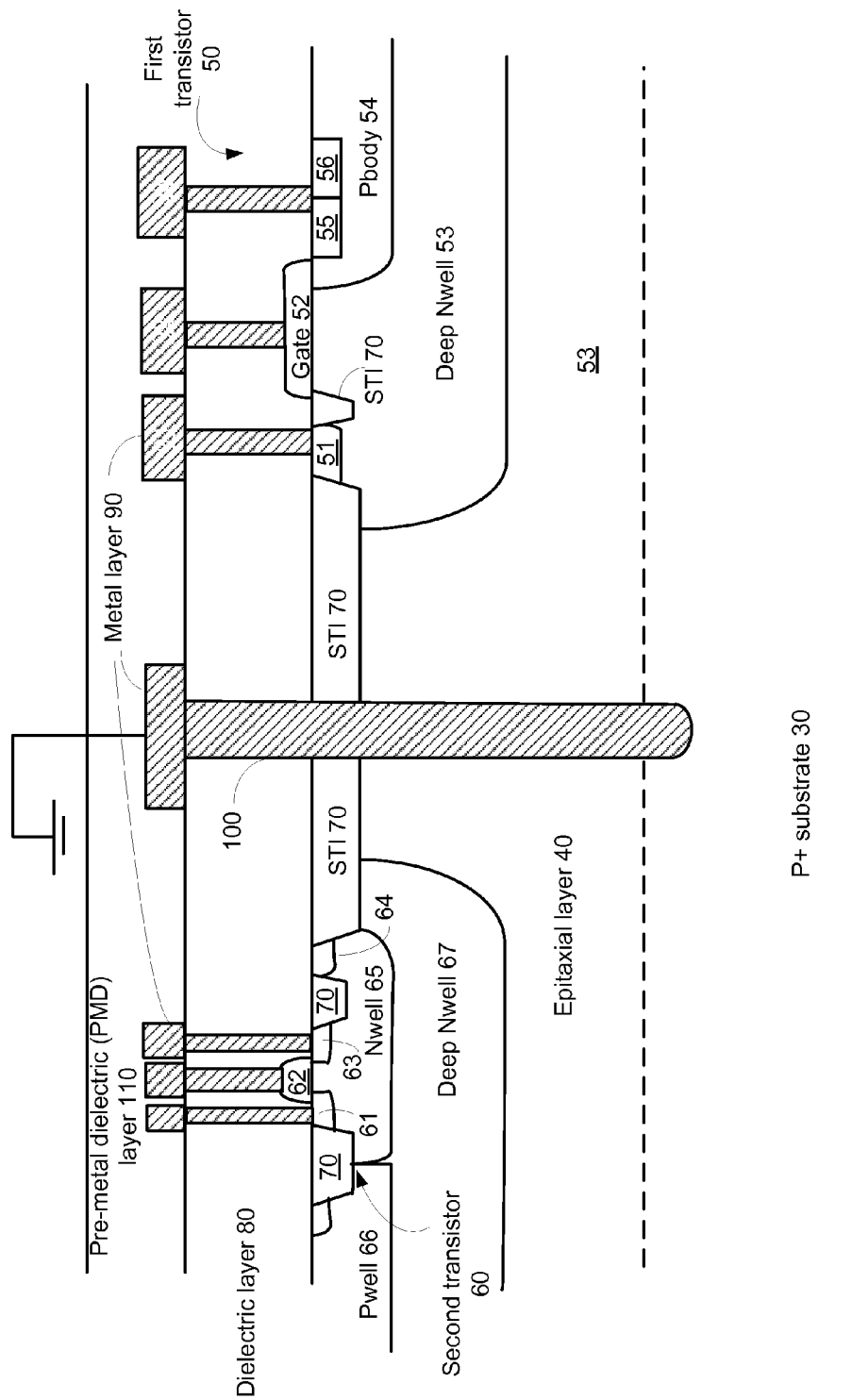
FIG. 1 is a cross sectional view of a portion of a semiconductor die according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The terms "high voltage" and "low voltage" refer to different levels of voltage. Low voltage usually refers to voltages that may not exceed few volts (for example—5 volts and below). High voltage usually refers to voltages that exceed few hundred volts (for example—200 volts and above)—and may exceed thousands of volts.

The terms "high power" and "low power" refer to different levels of power. Low power usually refers to power levels that do not exceed 1 Watt while high power usually refers to power level that exceeds 10 Watt.

There is provided a simple and relatively low cost BCD process using deep metal vias that are grounded and keep the substrate at ground potential by draining currents that are injected by the high power devices from the substrate. The metal via suppresses any cross talk between a noisy high power portion and a quiet analog portion of a power management semiconductor. In addition, having a low impedance connection to a heavily doped substrate can effectively lower the resistance of the substrate hence improving the reverse recovery of the Drain/Substrate diodes.

Figure 8:
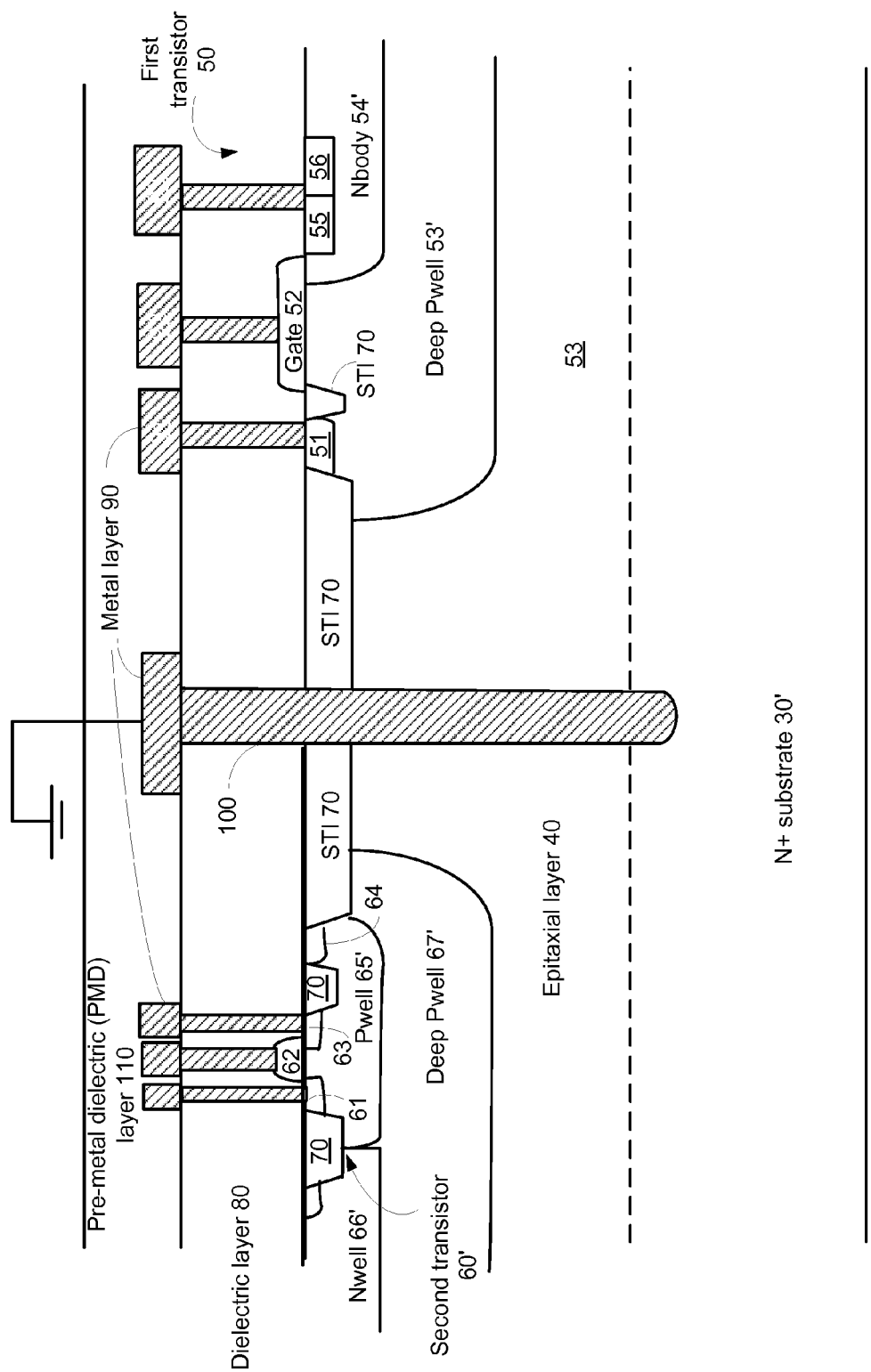
FIG. 8 is a cross sectional view of a portion of a semiconductor die according to an embodiment of the invention.

The metal via improves the isolation capabilities of a low mask count manufacturing processes (such as the manufacturing process used to manufacture the semiconductor die portions of FIGS. 1 and 8) without needing to use buried layers to get the required performance. In addition, the metal via can be used to remove heat from the substrate due to the high thermal conductivity of the metal via.

The metal via can contact layers at depths larger than what conventional implant and diffusion techniques can achieve for at a single epitaxial growth process (Viz. a combination of up and down sinker which limits the contacts to about 10 micron depth). This then also allows the implementation of this technique for thick epitaxial layers (>10 microns) silicon processes which enable use of higher voltage devices with a thicker depletion length.

The metal via can be narrow—and much narrower than diffusion based elements—and thus can reduce the space of the semiconductor die or increase the density of elements of the semiconductor die.

FIG. 1 is a cross sectional view of portion 11 of a semiconductor die according to an embodiment of the invention.

Portion 11 includes (a) heavily doped P-type substrate (P+ substrate) 30, (b) epitaxial layer 40 that is a p-type layer, (c) shallow trench isolators 70, (d) second transistor 60, (e) first transistor 50, (f) metal conductors of a metal layer 90 that are embedded in pre-metal dielectric (PMD) layer 110, and (g) metal via 100.

First transistor 50 includes gate 52, source 55, body 56 and drain 51. Source 55 and body 56 are surrounded by a P type region Pbody 54. Drain 51 is positioned between two STIs 70. Deep Nwell 53 surrounds drain 51, gate 52, Pbody 54 and an STI 70 that is positioned between drain 51 and gate 52.

Second transistor 60 includes gate 62, source 61, body 64 and drain 63. Body 64 is positioned between to STIs 70. Source 61 is delimited by STI 70. Nwell region 65 surrounds source 61, body 64, drain 63 and STIs 70. Pwell 66 interfaces with Nwell 65. Deep Nwell 67 surrounds Pwell 66 and Nwell 65.

Metal via 100 extends between metal layer 90 and P+ substrate 30 while penetrating P+ substrate 30.

The doping concentration of P+ substrate 30 well exceeds the doping concentration of epitaxial layer 40. For example—the ratio between the doping concentrations of P+ substrate 30 and epitaxial layer 40 may exceed one thousand.

Figure 7:
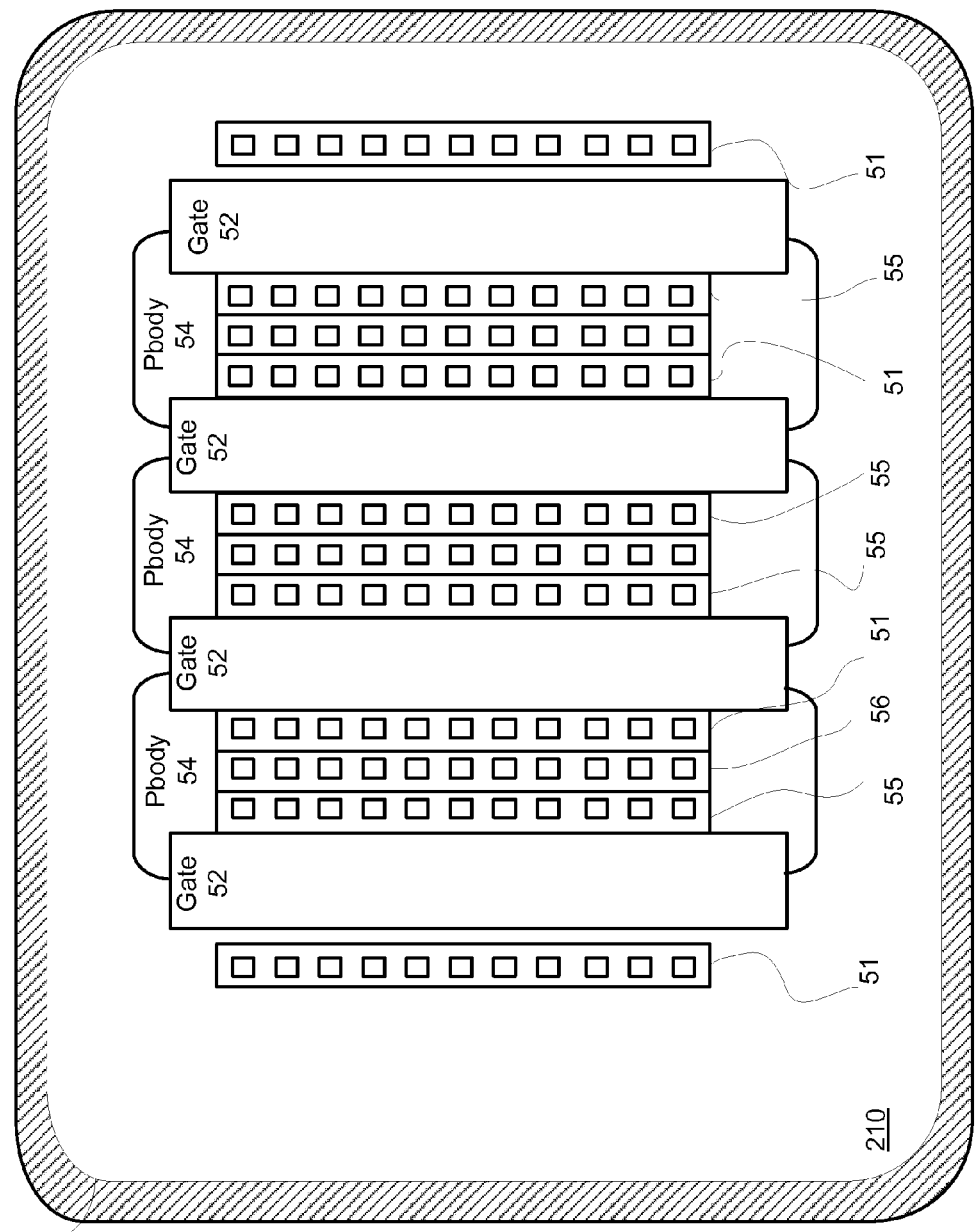
FIG. 7 is a top view of a portion of a semiconductor die according to an embodiment of the invention.

Metal via 100 surrounds first transistor 50 (as illustrated in FIG. 7). Especially—metal via 100 provides a continuous barrier that surrounds first transistor 50 within the dielectric layer 100, the epitaxial layer 40 and within an upper part of P+ substrate 30.

Metal via 100 forms a barrier that prevents electrons from propagating from deep Nwell 53 through epitaxial layer 40 to deep Nwell 67.

According to an embodiment metal via 100 is not isolated from its surroundings—it directly contacts epitaxial layer 40, STI 70, P+ substrate 30, dielectric layer 80 and PMD layer 110.

The lack of isolation between metal via 100 and its surroundings greatly simplifies the manufacturing process and reduces the cost of the manufacturing of the semiconductor die.

Metal via 100 directly contacts the P+ substrate and should be prevented from contacting n-type regions of die. Furthermore—metal via 100 should be spaced apart from any n-type regions of die—in order to prevent a formation of a depletion layer between metal via 100 and any n-type region.

In FIG. 1 P+ substrate 30 does not include any buried regions. This reduces the cost of manufacturing of the die.

Metal via 100 is grounded.

Second transistor 60 is positioned outside an area surrounded by the metal via 100. Metal via 100 is configured to isolate first transistor 50 from second transistor 60.

First transistor 50 may be a double diffused metal oxide (DMOS) transistor and second transistor 60 may be a complementary metal oxide transistor (CMOS). Alternatively—both first and second transistors 50 and 60 may be of the same type (both CMOS, both DMOS and the like).

First transistor 50 may belong to a high power circuit. Second transistor 50 may belong to a low power circuit. A power dissipated by the high power circuit exceeds a power dissipated by the low power circuit. Alternatively—both first and second transistors may belong to the same type of circuit.

Figure 2:
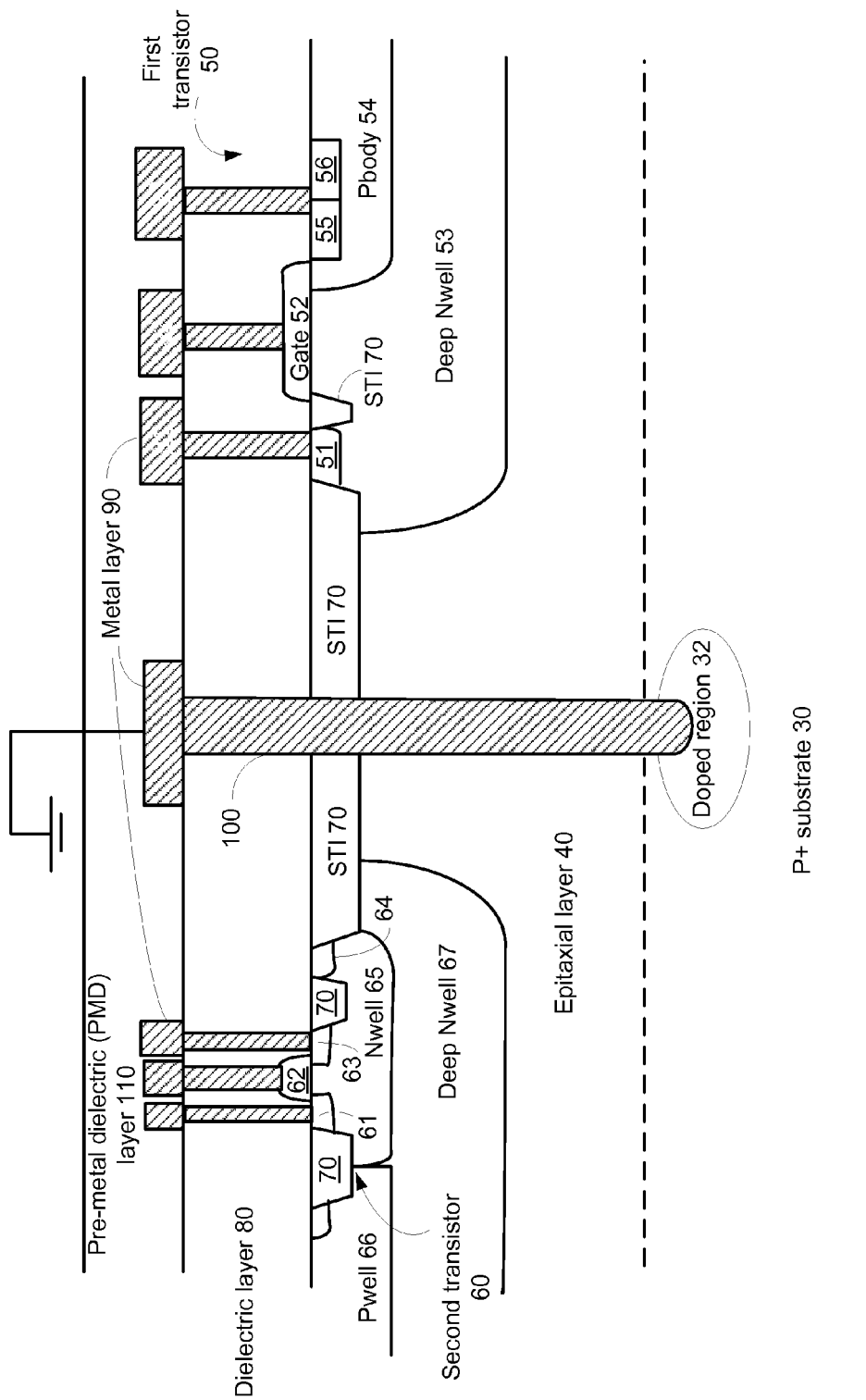
FIG. 2 is a cross sectional view of a portion of a semiconductor die according to an embodiment of the invention.

FIG. 2 is a cross sectional view of portion 12 of a semiconductor die according to an embodiment of the invention.

Portion 12 differs from portion 11 of FIG. 1 by including a doped region 32 that is buried within P+ substrate 30. The doping concentration of doped region 32 well exceeds the doping concentration of P+ substrate 30. The connection between metal via 100 and doped region can be an Ohamic contact or an almost Ohamic contact.

Figure 3:
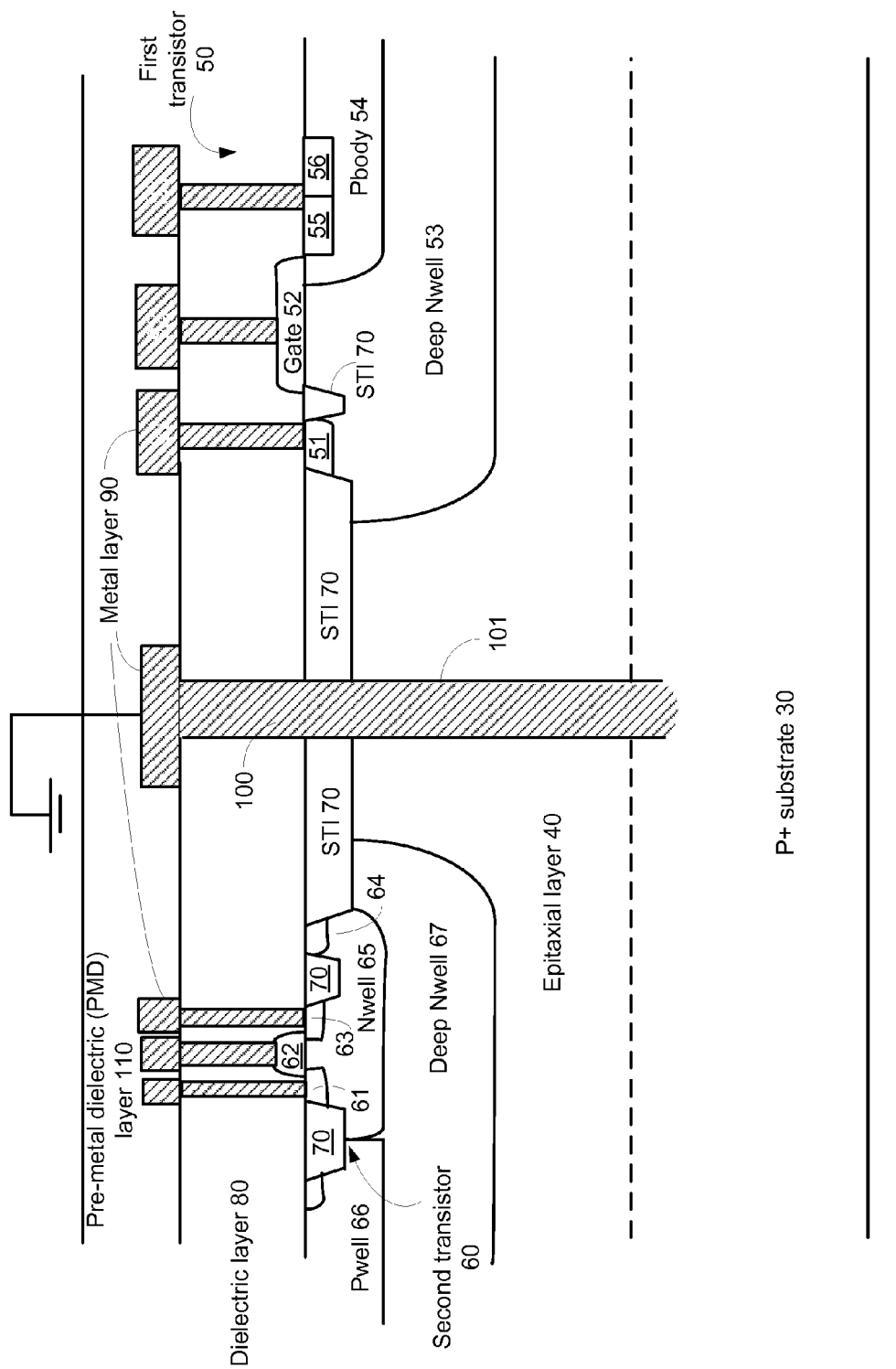
FIG. 3 is a cross sectional view of a portion of a semiconductor die according to an embodiment of the invention.

FIG. 3 is a cross sectional view of portion 13 of a semiconductor die according to an embodiment of the invention.

In FIG. 3 metal via 100 is coated with a coating 101. Coating 101 may be an insulating coating or a doped p-type semiconductor.

When coated with an insulating coating the metal via 100 may pass through any region of the semiconductor—regardless of the type (n-type or p-type) of the region.

When coated with a doped p-type semiconductor there is a better impedance match between the metal via 100 and its surrounding.

Figure 4:
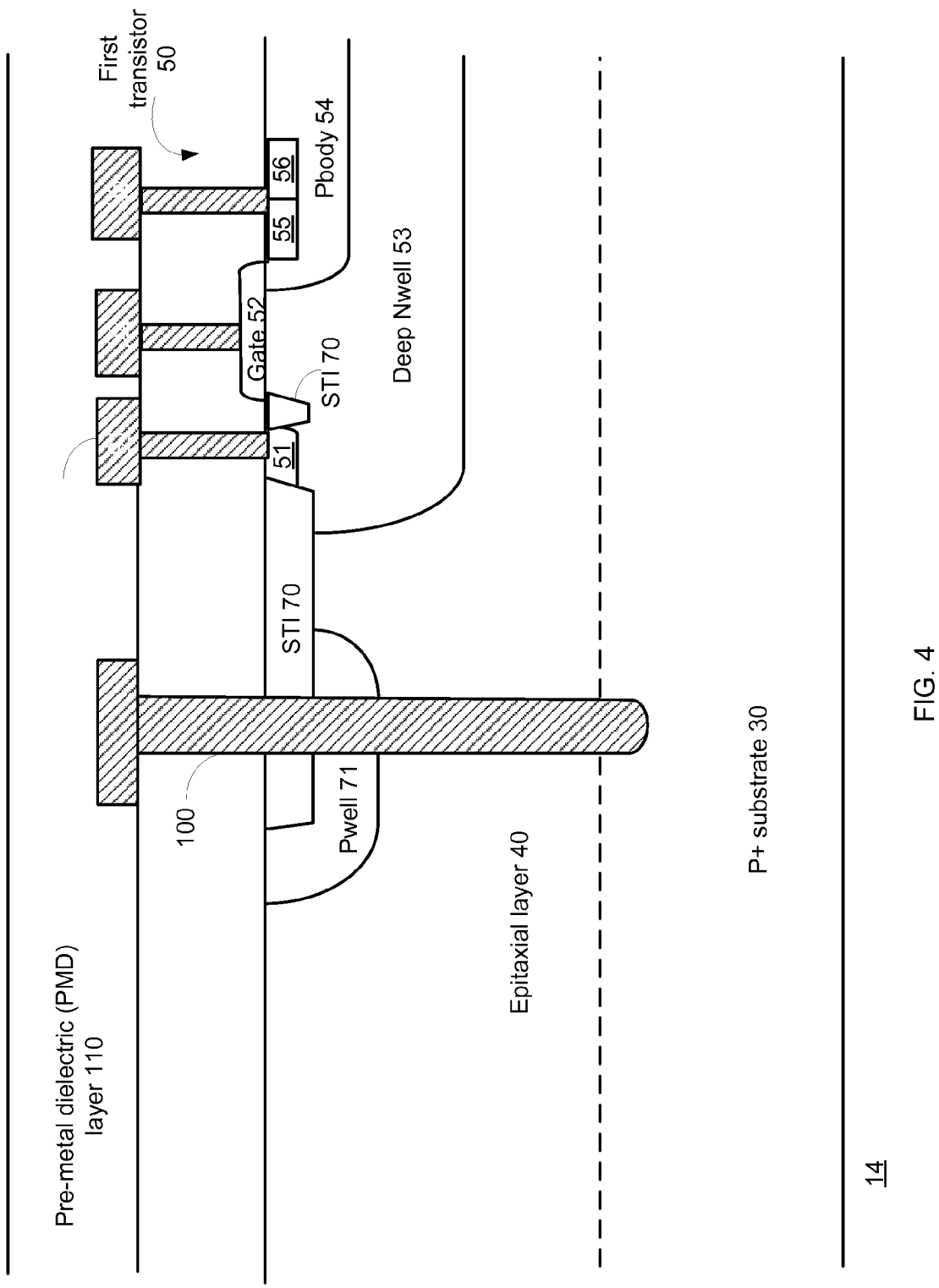
FIG. 4 is a cross sectional view of a portion of a semiconductor die according to an embodiment of the invention.

FIG. 4 is a cross sectional view of portion 14 of a semiconductor die according to an embodiment of the invention.

In FIG. 4 metal via 100 passes through dielectric layer 80, STI 70, Pwell 71, epitaxial layer 40 and penetrates P+ substrate 30.

Figure 5:
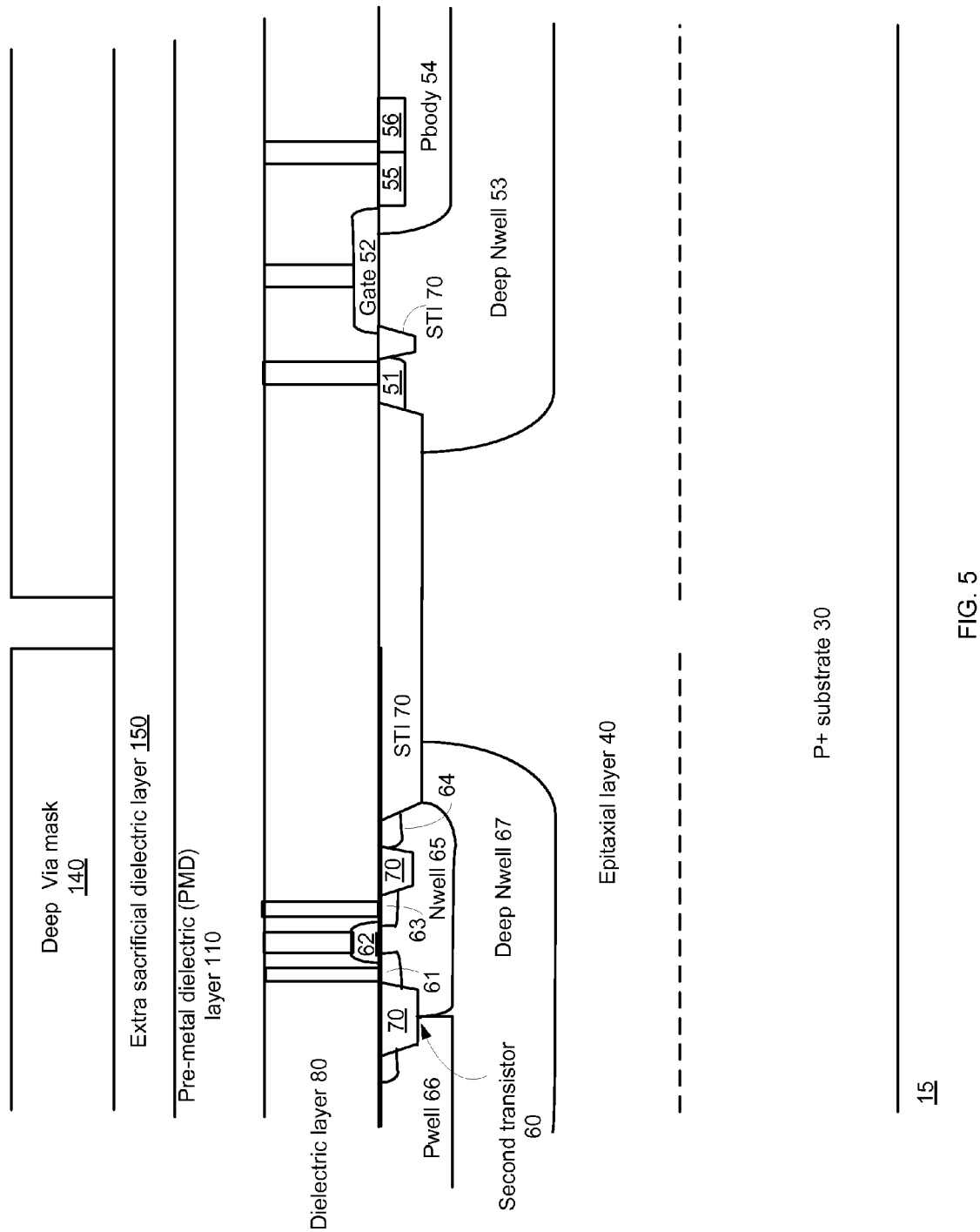
FIG. 5 is a cross sectional view of a portion of a semiconductor die according to an embodiment of the invention.

FIG. 5 illustrates a first manufacturing phase of metal via 100 according to an embodiment of the invention.

FIG. 5 illustrates the formation of an extra sacrificial dielectric layer 150 above PMD layer 110 and a formation of a deep via mask 140. Deep via mask 140 is a photoresist layer that has a void that matches the shape of the metal via.

Deep via mask 140 is etched by a dry etch process that removes the extra sacrificial dielectric layer 15, the PMD layer 110, the dielectric layer 80, STI 70, epitaxial layer 40 and part of P+ substrate 30—below the opening in deep via mask 140.

Figure 6:
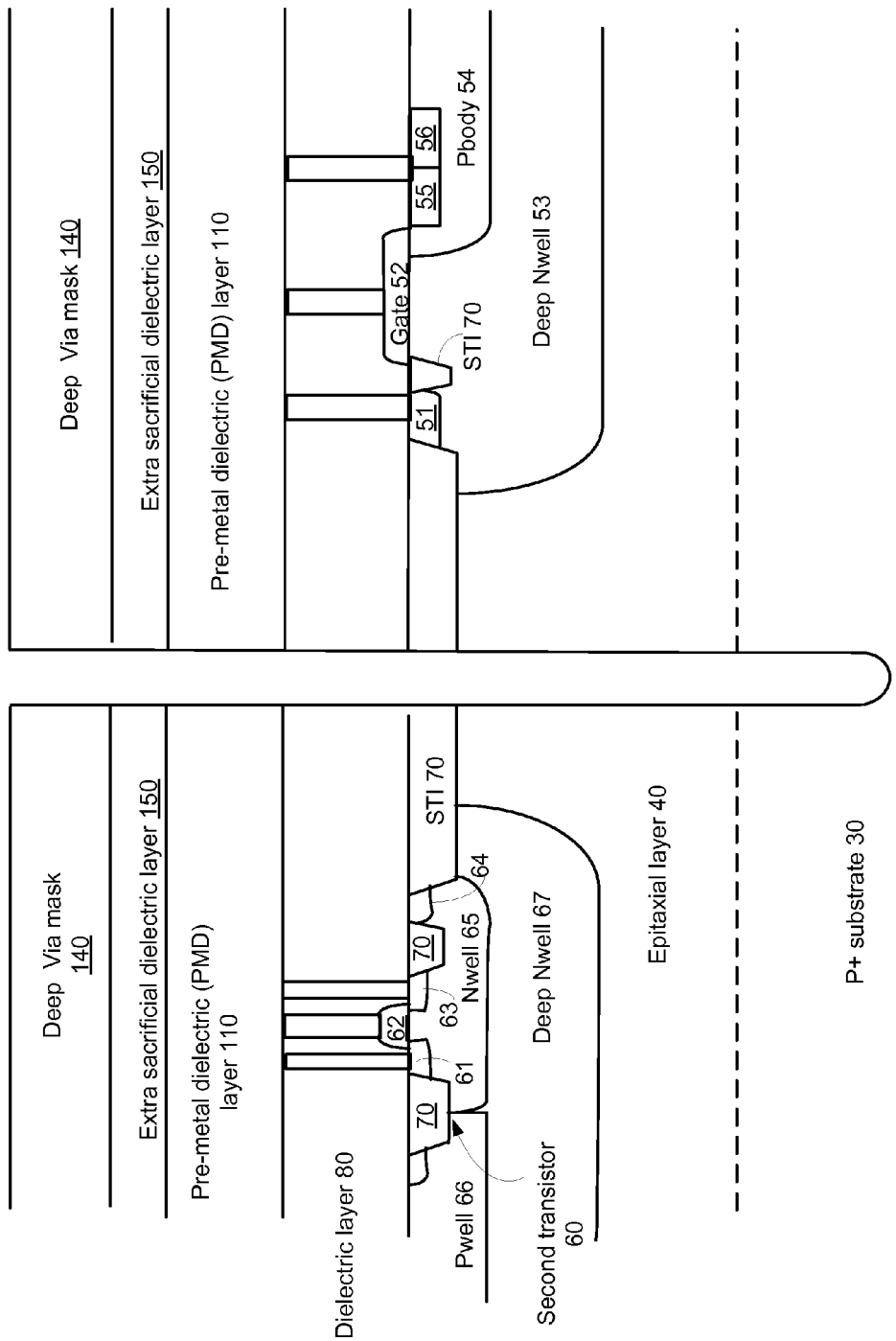
FIG. 6 is a cross sectional view of a portion of a semiconductor die according to an embodiment of the invention.

FIG. 6 illustrates a second manufacturing phase of metal via according to an embodiment of the invention.

FIG. 6 illustrates the outcome of the dry etch process—a void (shaped according to the opening in deep via mask 140) is formed in extra sacrificial dielectric layer 15, in PMD layer 110, in dielectric layer 80, STI 70, in epitaxial layer 40 and in part of P+ substrate 30.

The void is later filled with metal to form metal via 100. Extra sacrificial dielectric layer 150 and deep via mask 150 are removed from the semiconductor die.

FIG. 7 is a top via of a first transistor and metal via 100 according to an embodiment of the invention.

First transistor 50 is a high power transistors and includes four portions (also termed fingers) that are electrically coupled to each other. It is desirable that the drain of each portion will be closer to the metal via 100. Accordingly—the two left portions are mirrors of the two right portions. Each one of the four portions includes drain 51, gate 52, source 55 and body 56. A body 56 may be shared by adjacent portions. FIG. 7 also shows the spaced apart vias that are connected to each drain 51, gate 52, source 55 and body 56.

It is noted that metal via 100 may surround more than a single transistor. Metal via 100 may surround an entire high power region or surround only a portion of the high power region. Metal via 100 may surround an entire low power region or surround only a portion of the low power region.

While various figured illustrates a portion of a semiconductor die that includes a P+ substrate 30, the invention is applicable to semiconductor dies that have P substrates, N+ substrates and N substrates. Accordingly—any reference in the figures above to a p-type semiconductor region should be applicable to an n-type semiconductor region and vice versa.

FIG. 8 is a cross sectional view of portion 11' of a semiconductor die according to an embodiment of the invention.

Portion 11' of FIG. 8 differs from portion 11 by replacing n-type regions by p-type regions and by replacing p-type regions by n-type regions.

Portion 11' includes (a) substrate such as heavily doped N-type substrate (N+ substrate) 30', (b) epitaxial layer 40 that is an n-type layer, (c) STI 70, (d) second transistor 60', (e) first transistor 50', (f) metal conductors of a metal layer 90 that are embedded in pre-metal dielectric (PMD) layer 110, and (g) metal via 100.

First transistor 50' includes gate 52, source 55, body 56 and drain 51. Source 55 and body 56 are surrounded by a N type region Nbody 54'. Drain 51 is positioned between to STIs 70. Deep Pwell 53' surrounds drain 51, an STI positioned between drain 51 and gate 52, gate 52 and Nbody 54'.

Second transistor 60' includes gate 62, source 61, body 64 and drain 63. Body 64 is positioned between to STIs 70. Source 61 is delimited by STI 70. Pwell 65' surrounds source 61, body 64, drain 63 and STIs 70. Nwell 66' interfaces with Pwell 65'. Deep Pwell 67' surrounds Nwell 66' and Pwell 65'.

Metal via 100 extends between metal layer 90 and the N+ substrate 30' while penetrating N+ substrate 30'.

Figure 9:
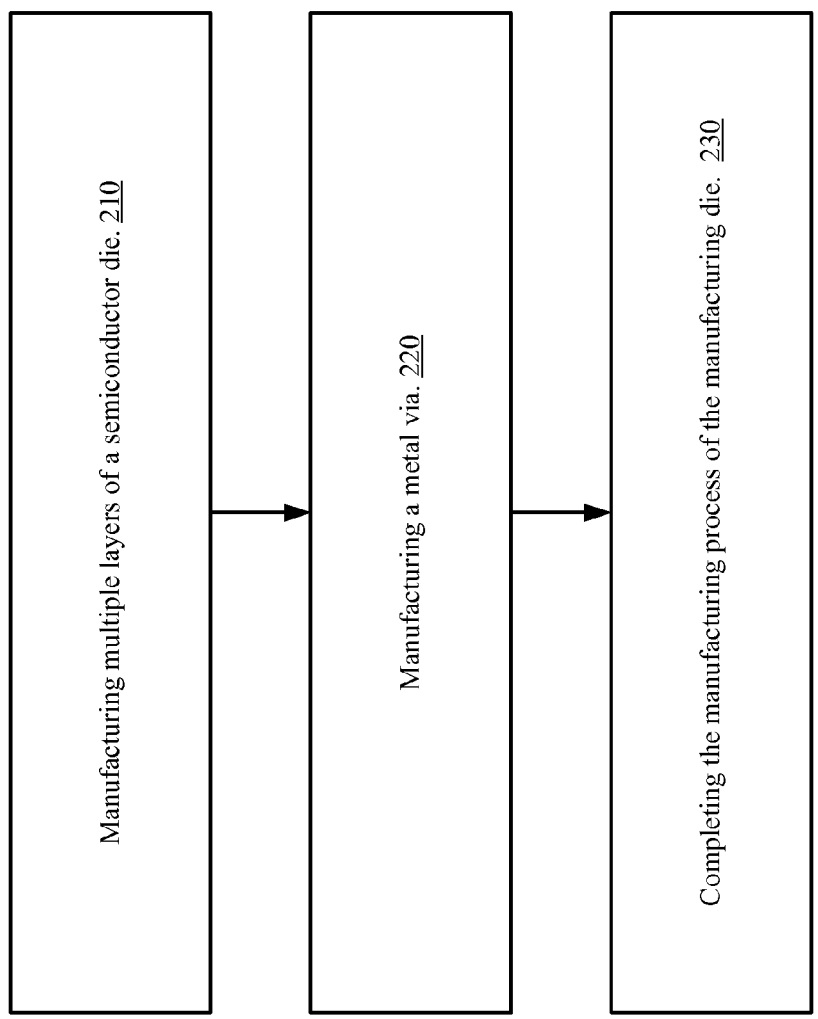
FIG. 9 illustrates a method according to an embodiment of the invention.

FIG. 9 illustrates method 200 according to an embodiment of the invention.

Method 200 includes manufacturing a semiconductor die that may include a metal via as illustrated in any of the previous figures.

Method 200 starts by step 210 of manufacturing multiple layers of a semiconductor die.

Step 210 may be followed by step 220 of manufacturing a metal via.

Step 220 is followed by step 230 of completing the manufacturing process of the manufacturing die.

At the end of step 230 the semiconductor die includes a substrate; an epitaxial layer; a metal layer; a first transistor and the metal via. The metal via surrounds the first transistor, extends between the metal layer and the substrate, and penetrates the substrate.

Step 210 may include:
a. Receiving or manufacturing a P-type silicon wafer with Epi layer (thickness~10 um, resistivity~10 ohm·cm) over P+ substrate (resistivity 0.01~0.05 ohm·cm)
b. Perform active area lithography.
c. Forming the HV Nwells by masking, implant, and thermal diffusion.
d. Forming the VLSI isolation oxide (STI, PBLOCOS or LOCOS)
e. Forming low voltage wells by lithography masks, implants and thermal activation
f. Forming LDMOS gate oxide and low-voltage gate dielectric layers by a combination of oxidation, deposition and selective dielectric etch steps
g. Depositing poly-Silicon gate material
h. Gate lines lithography and etch in low-voltage region and in LDMOS drain side
i. LDMOS source-side lithography followed by $2^{nd}$ poly-silicon etch
j. LDMOS body implant (see, for example U.S. Pat. No. 7,575,977)
k. LDMOS source side mask resist removal
l. LDMOS and low-voltage CMOS source/drain extension implants
m. Spacer formation (as in standard VLSI CMOS process)
n. N+ and P+ implants for source/drain regions and well contacts
o. Salicide blocking layer deposition and mask lithography followed by silicidation process
p. Deposition of the standard pre-metal dielectric (PMD) followed by the standard CMP of the PMD.

Step 220 may include:
a. Depositing an extra sacrificial dielectric (e.g. CVD $SiO_2$) that will be consumed during deep via mask processing
b. Deep via mask layer photolithography.
c. Deep via mask layer DSV etching
d. Optionally—in order to reduce metal via resistance—high-dose P+ implanting of the walls of the hole of the metal via that required for the formation of the ohmic contacts with the metal via.
e. Depositing a thin metal liner (e.g. Ti/TiN) followed by heating to high-enough temperature to lead to the activation of the implanted species f. CVD of tungsten for hole filling followed by CMP of the tungsten layer that leads to the planarization of the PMD.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A semiconductor die, comprising: a substrate; an epitaxial layer; a metal layer; a first transistor; and a metal via that surrounds all sides of the first transistor, extends between the metal layer and the substrate, and penetrates the substrate.

2. The semiconductor die according to claim 1 wherein the metal via directly contacts the epitaxial layer.

3. The semiconductor die according to claim 1 wherein the metal via is coated by an isolating material.

4. The semiconductor die according to claim 1 wherein the substrate and the epitaxial layer are n-type semiconductors.

5. The semiconductor die according to claim 4 wherein the metal via is prevented from contacting any p-type semiconductor region of the semiconductor die.

6. The semiconductor die according to claim 4 wherein the metal via is spaced apart from any p-type semiconductor region of the semiconductor die thereby preventing a formation of a depletion layer between the metal layer and any p-type semiconductor region of The semiconductor die.

7. The semiconductor die according to claim 1 wherein the substrate and the epitaxial layer are p-type semiconductors.

8. The semiconductor die according to claim 7 wherein the metal via is prevented from contacting any n-type semiconductor region of the semiconductor die.

9. The semiconductor die according to claim 7 wherein the metal via is spaced apart from any n-type semiconductor region of the semiconductor die thereby preventing a formation of a depletion layer between the metal layer and any n-type semiconductor region of the semiconductor die.

10. The semiconductor die according to claim 1 wherein the substrate does not comprise a buried region.

11. The semiconductor die according to claim 1 wherein the metal via contacts a buried region that is formed within the substrate; wherein the buried region has a higher doping concentration than the substrate.

12. The semiconductor die according to claim 11, wherein the metal via contacts the buried region to form a Ohmic contact.

13. The semiconductor die according to claim 1 wherein a depth of the metal via ranged between 5 and 50 micron.

14. The semiconductor die according to claim 1 wherein a width of a cross section of the metal via is between 1 and 3 microns.

15. The semiconductor die according to claim 1 further comprising a second transistor that is positioned outside an area surrounded by the metal via; wherein the metal via is configured to isolate the first transistor from the second transistor.

16. The semiconductor die according to claim 15 wherein the first transistor is a double diffused metal oxide transistor and wherein the second transistor is a complementary metal oxide transistor.

17. The semiconductor die according to claim 15 wherein the first transistor belong to a high power circuit; wherein the second transistor belongs to a low power circuit; wherein a power dissipated by the high power circuit exceeds a power dissipated by the low power circuit.

18. The semiconductor die according to claim 15 wherein the first transistor and the second transistor are of a same type of transistors.

19. The semiconductor die according to claim 1 wherein the metal via penetrates only a part of the substrate and wherein a bottom edge of the metal via is contacted by the substrate.

\* \* \* \* \*